US012707748B2

(12) United States Patent
Murashima

(10) Patent No.: US 12,707,748 B2
(45) Date of Patent: Aug. 11, 2026

(54) SEMICONDUCTOR DEVICE WITH BLOCKS INCLUDING UNITS WITH A PROTECTION ELEMENT AND A BUMP CONNECTED TO A MAIN UNIT

(71) Applicant: SONY SEMICONDUCTOR SOLUTIONS CORPORATION, Kanagawa (JP)

(72) Inventor: Akihiko Murashima, Fukuoka (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 389 days.

(21) Appl. No.: 18/263,931

(22) PCT Filed: Jan. 5, 2022

(86) PCT No.: PCT/JP2022/000064

§ 371 (c)(1),
(2) Date: Aug. 2, 2023

(87) PCT Pub. No.: WO2022/172647

PCT Pub. Date: Aug. 18, 2022

(65) Prior Publication Data

US 2024/0128220 A1 Apr. 18, 2024

(30) Foreign Application Priority Data

Feb. 15, 2021 (JP) ................................ 2021-021608

(51) Int. Cl.
*H10F 39/00* (2025.01)
*H05K 1/14* (2006.01)
(Continued)

(52) U.S. Cl.
CPC ........ *H10F 39/811* (2025.01); *H10W 20/427* (2026.01); *H10W 90/722* (2026.01)

(58) Field of Classification Search
CPC .......... H05K 1/14; H05K 3/36; H01L 25/065; H01L 25/07; H01L 25/18; H01L 23/5286;
(Continued)

(56) References Cited

U.S. PATENT DOCUMENTS

2003/0097641 A1 5/2003 Wachi
2009/0153177 A1* 6/2009 Shibata ................ G11C 29/022
257/E23.141

(Continued)

FOREIGN PATENT DOCUMENTS

JP 2003-152081 5/2003
JP 2007-165720 6/2007

(Continued)

OTHER PUBLICATIONS

International Search Report and Written Opinion prepared by the Japan Patent Office on Mar. 22, 2022, for International Application No. PCT/JP2022/000064, 3 pgs.

*Primary Examiner* — Sonya McCall-Shepard
(74) *Attorney, Agent, or Firm* — SHERIDAN ROSS P.C.

(57) ABSTRACT

The present disclosure relates to a semiconductor device capable of reducing design load.
Provided is a semiconductor device including: a first substrate; and a second substrate bonded to the first substrate with a bonding portion where a bump is bonded, in which the bump pairs up with a predetermined function to constitute a unit. The present disclosure is applicable to, for example, a photodetection device such as a solid-state imaging device.

10 Claims, 20 Drawing Sheets

(51) Int. Cl.

| | |
|---|---|
| ***H05K 3/36*** | (2006.01) |
| ***H10D 84/00*** | (2025.01) |
| ***H10D 84/03*** | (2025.01) |
| ***H10D 89/60*** | (2025.01) |
| ***H10W 20/41*** | (2026.01) |
| ***H10W 72/00*** | (2026.01) |
| ***H10W 72/20*** | (2026.01) |
| ***H10W 90/00*** | (2026.01) |

(58) Field of Classification Search

CPC ......... H01L 24/14; H01L 24/17; H01L 24/19; H01L 23/3128; H01L 24/05; H01L 24/16; H01L 2224/0401; H01L 2224/04105; H01L 2224/12105; H01L 2224/16148; H01L 2224/16238; H01L 2224/1703; H01L 2224/17517; H01L 2224/81191; H01L 2224/81193; H01L 2225/06513; H01L 2225/06517; H01L 2924/15311; H01L 2924/18162; H01L 25/0657; H01L 2224/16145; H01L 2224/32145; H01L 2224/1713; H01L 2224/14515; H10F 39/811; H10F 39/809; H10W 72/072; H10W 72/267; H10W 90/722; H10W 90/00; H10W 72/241; H10W 72/248; H10D 84/00; H10D 89/60

See application file for complete search history.

(56) References Cited

U.S. PATENT DOCUMENTS

| | | | | |
|---|---|---|---|---|
| 2011/0304010 | A1* | 12/2011 | Jiang ..................... | H10W 90/00 257/528 |
| 2012/0153433 | A1* | 6/2012 | Yen ....................... | H10W 42/60 257/659 |
| 2012/0162836 | A1 | 6/2012 | Furuta et al. | |
| 2014/0145266 | A1 | 5/2014 | Ishikawa | |
| 2015/0145053 | A1 | 5/2015 | Ishikawa | |

FOREIGN PATENT DOCUMENTS

| | | |
|---|---|---|
| JP | 2010-206021 | 9/2010 |
| JP | 2012-134380 | 7/2012 |
| JP | 2017-175047 | 9/2017 |
| JP | 2018-014524 | 1/2018 |

* cited by examiner 12
201-1
231-1
222
201-2
231-2
221
212
211
213
MAIN CIRCUIT
MAIN CIRCUIT
113
111
112
121
11
MAIN CIRCUIT
MAIN CIRCUIT
MAIN CIRCUIT
101-1
131-1
122
101-2
131-2
101-3
131-3

331
332
301-11
311-11
301-21
311-21
301-22
311-22
301-23
311-23
301-31
311-31
301-32
311-32
301-33
311-33
301-34
311-34
301-42
311-42
301-43
311-43
301-44
311-44
VDD
VSS

SEMICONDUCTOR DEVICE WITH BLOCKS INCLUDING UNITS WITH A PROTECTION ELEMENT AND A BUMP CONNECTED TO A MAIN UNIT

CROSS REFERENCE TO RELATED APPLICATIONS

This application is a national stage application under 35 U.S.C. 371 and claims the benefit of PCT Application No. PCT/JP2022/000064, having an international filing date of 5 Jan. 2022, which designated the United States, which PCT application claimed the benefit of Japanese Patent Application No. 2021-021608, filed 15 Feb. 2021, the entire disclosures of each of which are incorporated herein by reference.

TECHNICAL FIELD

The present disclosure relates to a semiconductor device, and particularly relates to a semiconductor device capable of reducing design load.

BACKGROUND ART

Bump bonding with bumps has been used for structures such as a chip-on-chip (CoC) structure and a chip-on-wafer (CoW) structure (see, for example, Patent Document 1).

The bump bonding in the CoC structure and the CoW structure requires an ancillary circuit with consideration given to a reliability factor such as electrostatic discharge (ESD) at the time of bonding. In addition, the bump bonding also requires design with consideration given to delay information and power consumption for signal exchange between substrates.

CITATION LIST

Patent Document

Patent Document 1: Japanese Patent Application Laid-Open No. 2017-175047

SUMMARY OF THE INVENTION

Problems to be Solved by the Invention

However, the use of the bump bonding becomes a burden in terms of both quality and efficiency of design in a case of a large-scale connection path, and cannot flexibly address a change in design, and the like. A technique for reducing design load has therefore been required.

The present disclosure has been made in view of such a situation, and enables reduction in design load.

Solutions to Problems

A semiconductor device according to one aspect of the present disclosure is a semiconductor device including: a first substrate; and a second substrate bonded to the first substrate with a bonding portion where a bump is bonded, in which the bump pairs up with a predetermined function to constitute a unit.

The semiconductor device according to one aspect of the present disclosure includes: the first substrate; and the second substrate bonded to the first substrate with the bonding portion where the bump is bonded, and the bump pairs up with the predetermined function to constitute the unit.

Note that the semiconductor device according to one aspect of the present disclosure may be an independent device or an internal block constituting one device.

MODE FOR CARRYING OUT THE INVENTION

1. Embodiment of Present Disclosure (Configuration of Semiconductor Device)

Figure 1:
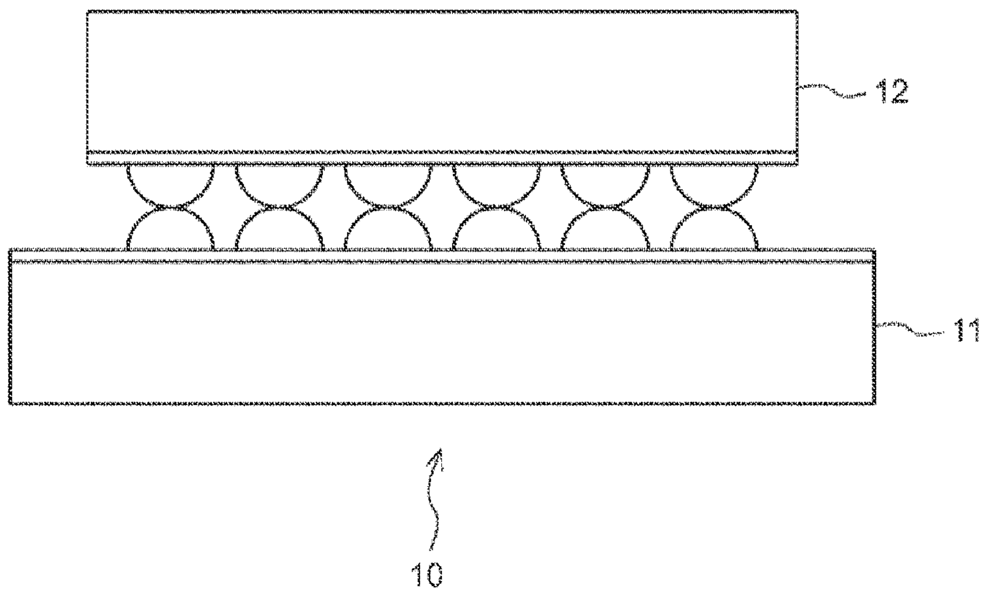
FIG. 1 is a diagram illustrating a configuration example of a semiconductor device to which the present disclosure is applied.
Figure 2:
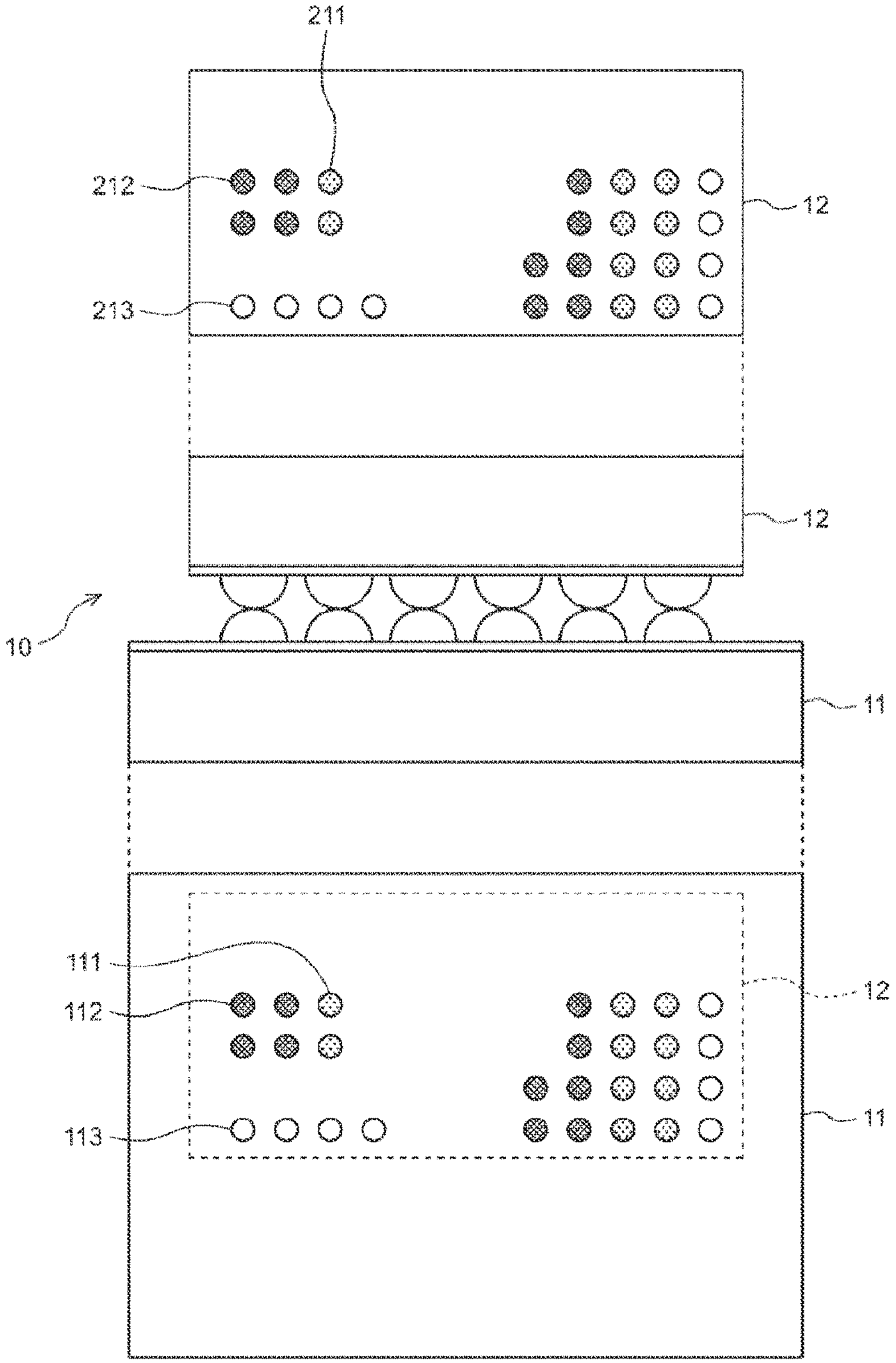
FIG. 2 is a diagram illustrating a configuration example of the semiconductor device to which the present disclosure is applied.

FIGS. 1 and 2 are diagrams each illustrating a configuration example of a semiconductor device to which the present disclosure is applied.

FIG. 1 illustrates a front view of a semiconductor device 10. In FIG. 1, the semiconductor device 10 includes a substrate 11 and a substrate 12. Bumps are formed on each of the substrate 11 and the substrate 12. The bumps are arranged so as to face each other and are subjected to press bonding, heating, and the like to form a bonding portion.

FIG. 2 illustrates an arrangement example of the bumps formed on opposite surfaces of the substrates 11 and 12. In the substrate 11, the plurality of bumps, such as bumps 111, 112, and 113, is formed at a predetermined position on the surface facing the substrate 12. In the substrate 12, the plurality of bumps, such as bumps 211, 212, and 213, is formed at a predetermined position on the surface facing the substrate 11. The plurality of bumps formed on the substrate 11 is arranged in alignment with the plurality of bumps formed on the substrate 12.

(Internal Configuration)

Figure 3:
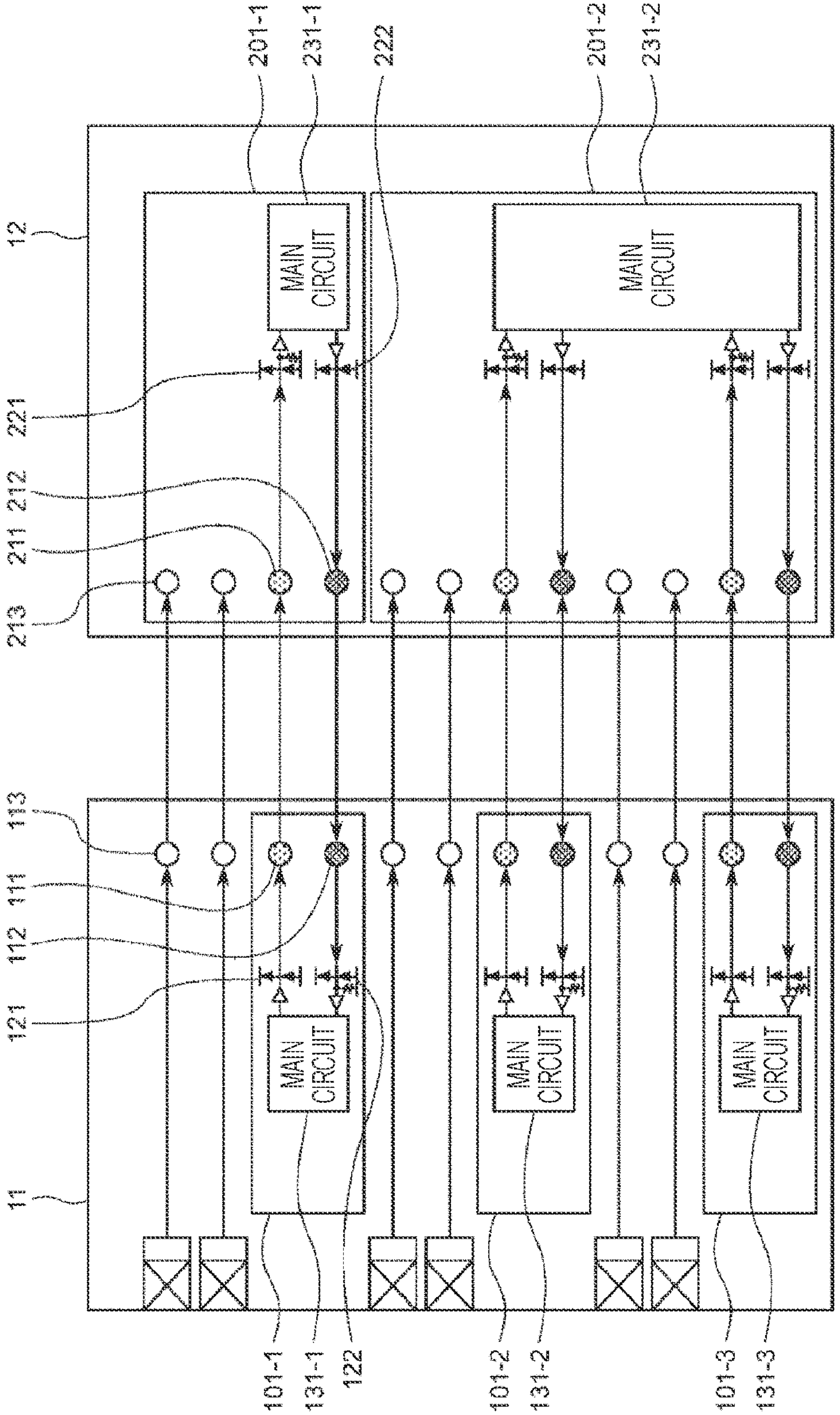
FIG. 3 is a diagram illustrating a configuration of bump-bonded substrates in an existing semiconductor device.
Figure 4:
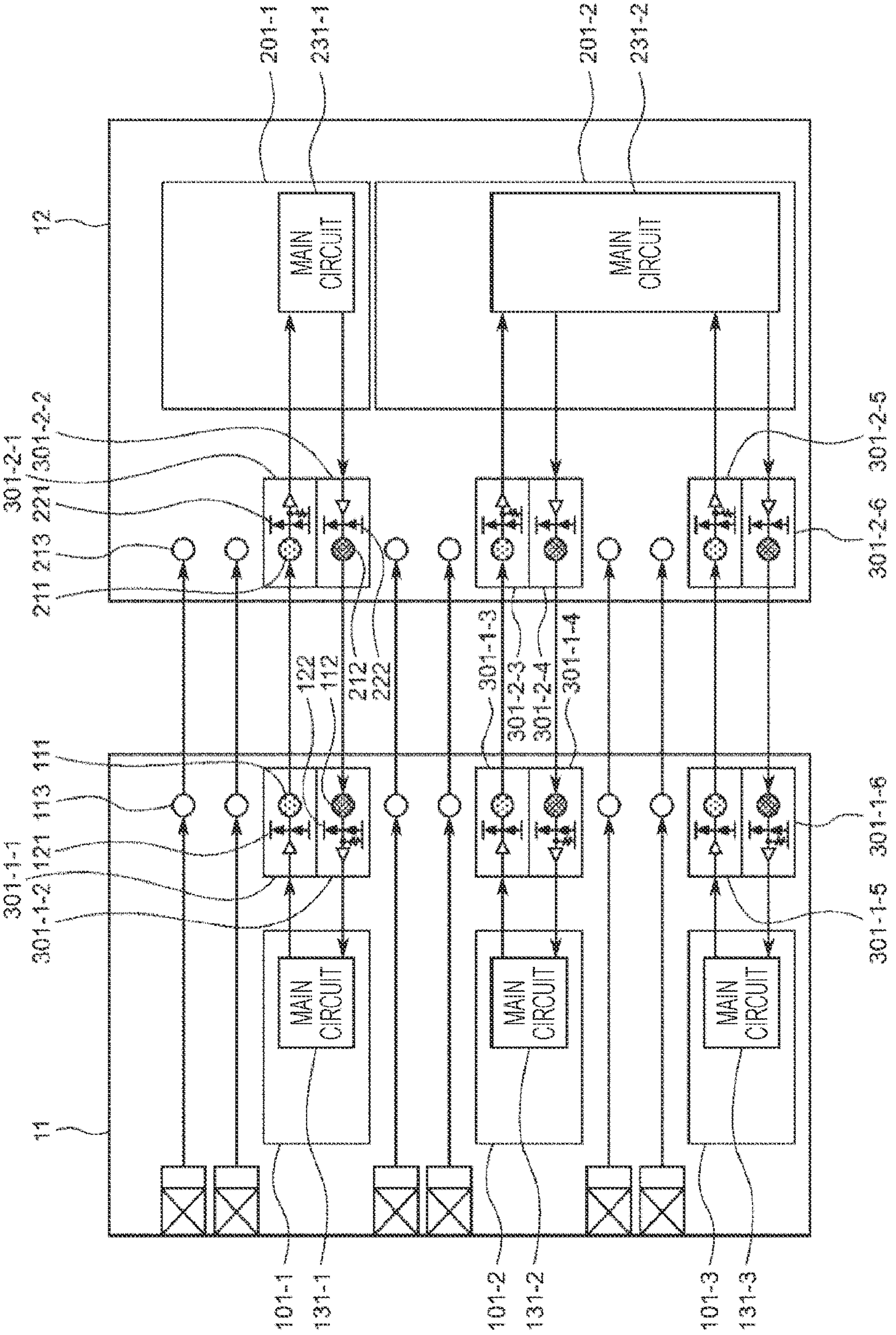
FIG. 4 is a diagram illustrating a configuration example of bump-bonded substrates in the semiconductor device to which the present disclosure is applied.

Configurations of the bump-bonded substrates 11 and 12 in the semiconductor device 10 will be described next. Here, for a comparison with the substrates 11 and 12 to which the present disclosure is applied, configurations of bump-bonded substrates in an existing semiconductor device are illustrated in FIG. 3. The configurations of the substrates 11 and 12 to which the present disclosure is applied are illustrated in FIG. 4.

In FIG. 3, a substrate 11 and a substrate 12 are bonded together with a plurality of bumps, such as bumps 111, 112, and 113, and bumps 211, 212, and 213.

The substrate 11 includes blocks 101-1 to 101-3. Each block 101 includes the bumps 111 and 112, circuits 121 and 122 each including a protection element and the like, and a main circuit 131 which carries out various types of processing. The substrate 12 includes blocks 201-1 and 201-2. Each block 201 includes the bumps 211, 212, and 213, circuits 221 and 222 each including a protection element and the like, and a main circuit 231 which carries out various types of processing.

In the substrate 11 and the substrate 12, the block 101-1 and the block 201-1 are electrically connected to each other with the bumps, so that a main circuit 131-1 and a main circuit 231-1 can exchange various signals with each other. Similarly, the blocks 101-2 and 101-3 and the block 201-2 are electrically connected to each other with the bumps, so that main circuits 131-2 and 131-3 and a main circuit 231-2 can exchange various signals with each other.

As illustrated in FIG. 3, bump bonding of substrates in a structure such as a CoC structure requires ancillary circuits (e.g., the circuits 121 and 122, the circuits 221 and 222) with consideration given to a reliability factor such as ESD at the time of bonding. In addition, the bump bonding also requires design with consideration given to delay information and power consumption for signal exchange between the substrates.

Here, in a case of a large-scale (e.g., several hundred levels) bump connection path, performing all the processes under the category of analog design becomes a burden in terms of both quality and efficiency. In addition, there is a possibility that changes in design are also required for past design resources such as functional block circuits including bumps, and macros, and intellectual property (IP) cores of a third party.

As described above, the configuration of the existing substrate becomes a burden in terms of both quality and efficiency of design in the case of a large-scale connection path and cannot flexibly address a change in design, and the like. A technique for reducing design load has therefore been required. Hence, in the semiconductor device to which the present disclosure is applied, a bump and a function are configured as a pair of units to reduce design load. Detailed configurations of the semiconductor device to which the present disclosure is applied will be described below with reference to FIGS. 4 to 28.

(Configurations of Bump-Bonded Substrates)

FIG. 4 is a diagram illustrating a configuration example of the bump-bonded substrates in the semiconductor device to which the present disclosure is applied. In FIG. 4, parts corresponding to those in FIG. 3 are denoted by the same reference numerals, and description thereof will be omitted as appropriate.

In FIG. 4, the substrate 11 and the substrate 12 are bonded together with the plurality of bumps, such as the bumps 111, 112, and 113, and the bumps 211, 212, and 213.

In the substrate 11, a block 101-1 includes a main circuit 131-1. The main circuit 131-1 is connected to units 301-1-1 and 301-1-2. The unit 301-1-1 includes the bump 111 and a circuit 121 including a protection element and the like. The unit 301-1-2 includes the bump 112 and a circuit 122 including a protection element and the like.

Furthermore, in the substrate 11, a main circuit 131-2 included in a block 101-2 is connected to units 301-1-3 and 301-1-4, and a main circuit 131-3 included in a block 101-3 is connected to units 301-1-5 and 301-1-6. Each of the units 301-1-3 to 301-1-6 includes, similar to the units 301-1-1 and 301-1-2, a bump and a circuit including a protection element and the like.

In the substrate 12, a block 201-1 includes a main circuit 231-1. The main circuit 231-1 is connected to units 301-2-1 and 301-2-2. The unit 301-2-1 includes the bump 211 and a circuit 221 including a protection element and the like. The unit 301-2-2 includes the bump 212 and a circuit 222 including a protection element and the like.

Furthermore, in the substrate 12, a main circuit 231-2 included in the block 201-2 is connected to units 301-2-3 and 301-2-4 and units 301-2-5 and 301-2-6. Each of the units 301-2-3 to 301-2-6 includes, similar to the units 301-2-1 and 301-2-2, a bump and a circuit including a protection element and the like.

In the substrate 11 and the substrate 12, the unit 301-1-1 and the unit 301-2-1 are electrically connected to each other with the bumps, and the unit 301-1-2 and the unit 301-2-2 are electrically connected to each other with the bumps, so that the main circuit 131-1 and the main circuit 231-1 can exchange various signals with each other.

Similarly, the unit 301-1-3 and the unit 301-2-3 are electrically connected to each other with the bumps, the unit 301-1-4 and the unit 301-2-4 are electrically connected to each other with the bumps, the unit 301-1-5 and the unit 301-2-5 are electrically connected to each other with the bumps, and the unit 301-1-6 and the unit 301-2-6 are electrically connected to each other with the bumps, so that each of the main circuits 131-2 and 131-3 and the main circuit 231-2 can exchange various signals with each other.

In each of the units 301 of the substrates 11 and 12, a bump and a minimum function are configured as a pair of units having information regarding an operation model, a delay, power consumption, and the like. An example of a combination of the bump and the function is described with equivalent circuits illustrated in FIGS. 5 to 21.

Note that the unit 301-1-*i* (i: an integer which is not less than one) on the substrate 11 side and the unit 301-2-*j* (j: an integer which is not less than one) on the substrate 12 side are described as the units 301 in a case where these units are not necessarily distinguished from each other. For convenience of the description, moreover, the bumps 111 and 112 on the substrate 11 side and the bumps 211 and 212 on the substrate 12 side are described as bumps 311 without being distinguished from each other.

First Example

Figure 5:
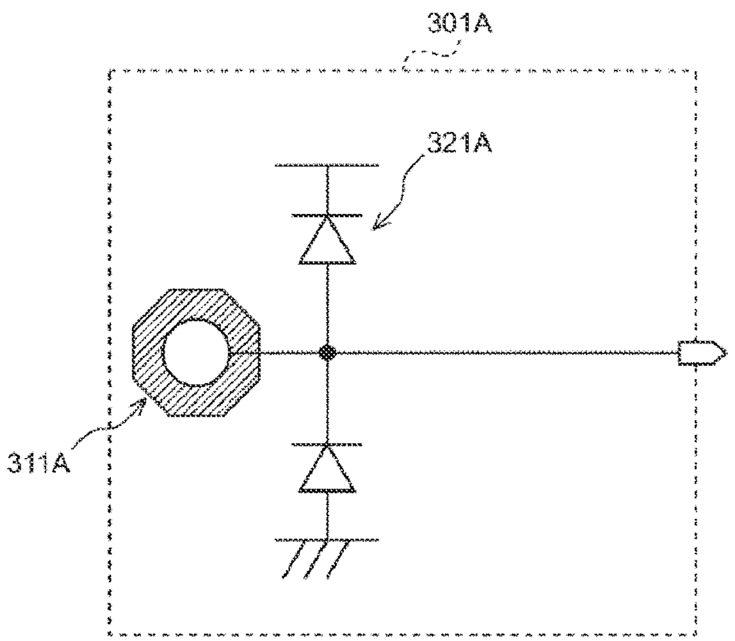
FIG. 5 is a diagram illustrating a first example of a configuration of a unit.

FIG. 5 is a diagram illustrating a first example of the configuration of each unit 301.

In FIG. 5, a unit 301A includes a bump 311A and a protection element 321A. In conjunction with the bump 311A, the unit 301A has, as a minimum function, a protection function by the protection element 321A.

Figure 6:
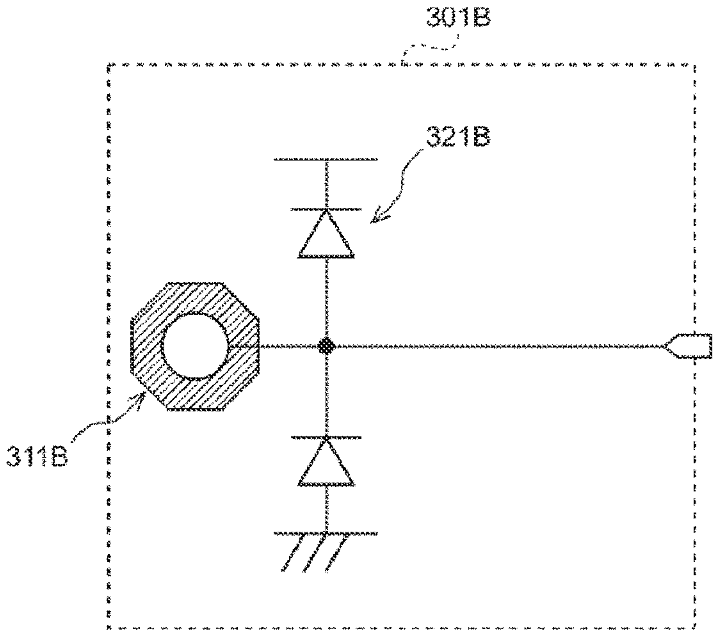
FIG. 6 is a diagram illustrating the first example of the configuration of the unit.

Note that FIG. 5 illustrates a configuration of the unit 301A in a case of an input, and FIG. 6 illustrates a configuration in a case of an output. In FIG. 6, a unit 301B includes a bump 311B and a protection element 321B.

Second Example

Figure 7:
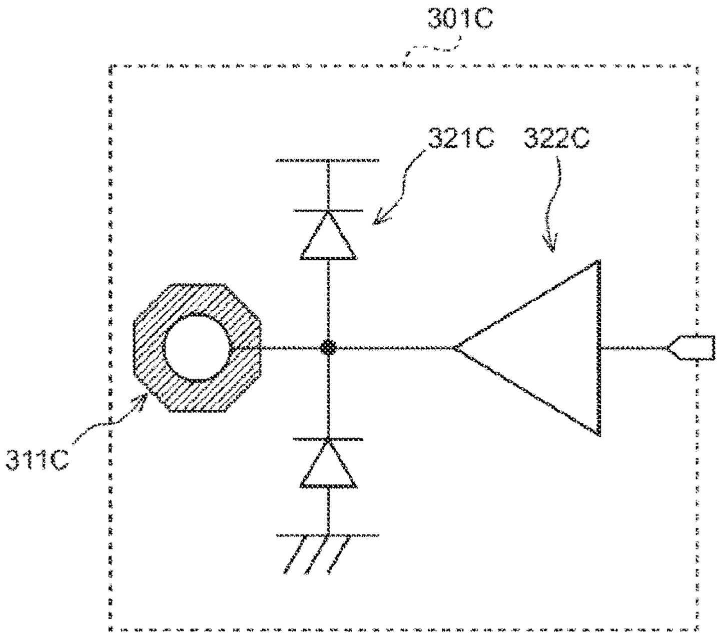
FIG. 7 is a diagram illustrating a second example of the configuration of the unit.

FIG. 7 is a diagram illustrating a second example of the configuration of each unit 301.

In FIG. 7, a unit 301C includes a bump 311C, a protection element 321C, and an output circuit 322C. In conjunction with the bump 311C, the unit 301C has, as minimum functions, a protection function by the protection element 321C and an output function by the output circuit 322C.

Third Example

Figure 8:
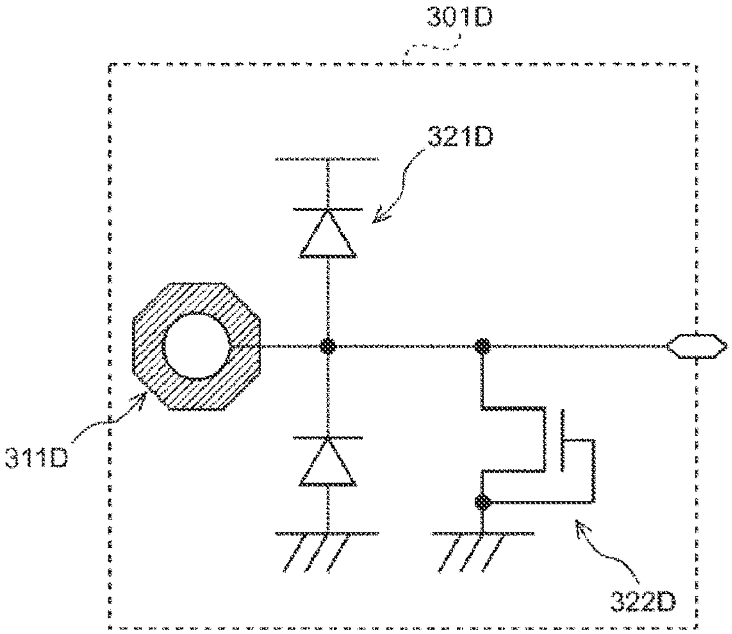
FIG. 8 is a diagram illustrating a third example of the configuration of the unit.

FIG. 8 is a diagram illustrating a third example of the configuration of each unit 301.

In FIG. 8, a unit 301D includes a bump 311D, a protection element 321D, and a power supply circuit 322D. In conjunction with the bump 311D, the unit 301D has, as minimum functions, a protection function by the protection element 321D and a power supply function by the power supply circuit 322D.

Fourth Example

Figure 9:
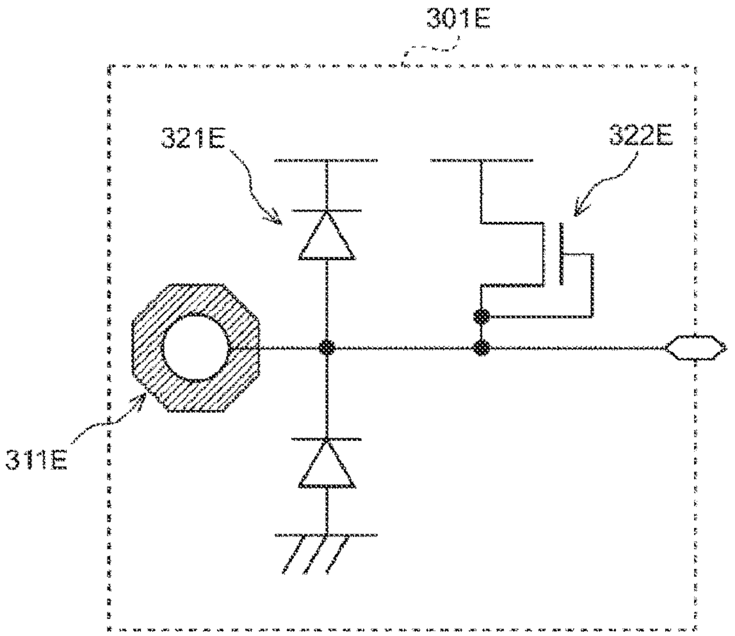
FIG. 9 is a diagram illustrating a fourth example of the configuration of the unit.

FIG. 9 is a diagram illustrating a fourth example of the configuration of each unit 301.

In FIG. 9, a unit 301E includes a bump 311E, a protection element 321E, and a GND supply circuit 322E. In conjunction with the bump 311E, the unit 301E has, as minimum functions, a protection function by the protection element 321E and a ground supply function by the GND supply circuit 322E.

Fifth Example

Figure 10:
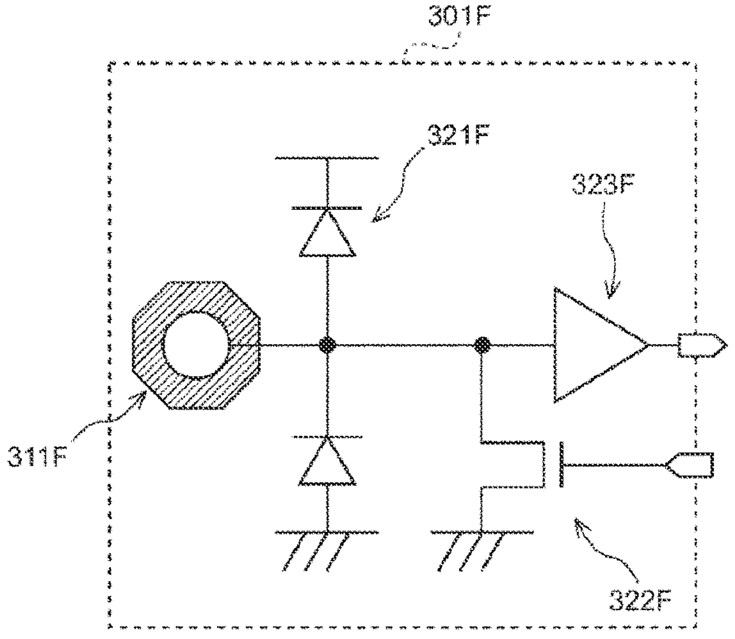
FIG. 10 is a diagram illustrating a fifth example of the configuration of the unit.

FIG. 10 is a diagram illustrating a fifth example of the configuration of each unit 301.

In FIG. 10, a unit 301F includes a bump 311F, a protection element 321F, a control circuit 322F, and an input circuit 323F. In conjunction with the bump 311F, the unit 301F has, as minimum functions, a protection function by the protection element 321F, a control function by the control circuit 322F, and an input function by the input circuit 323F.

Note that the control circuit 322F may have, for example, a function for preventing unstable operation of the bump 311F in a non-contact state (in an open state). Other control circuits to be described later may have a function similar to that of the control circuit 322F.

Sixth Example

Figure 11:
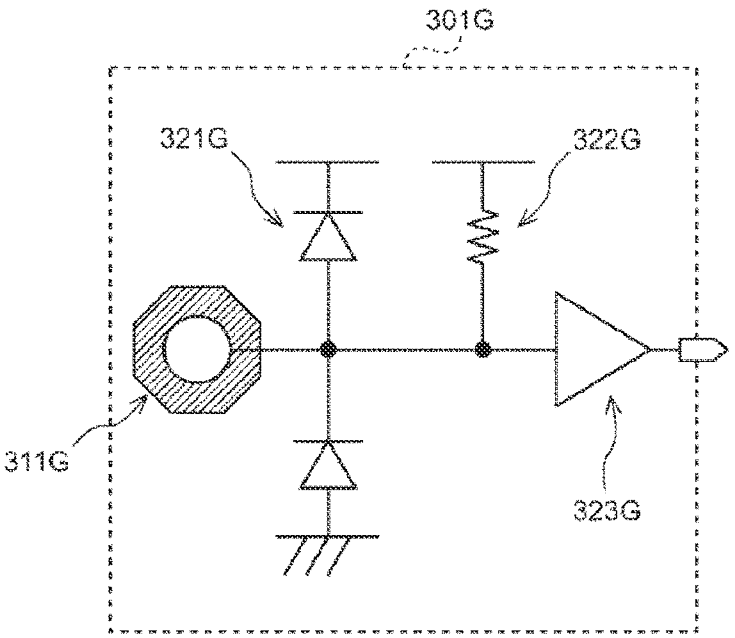
FIG. 11 is a diagram illustrating a sixth example of the configuration of the unit.

FIG. 11 is a diagram illustrating a sixth example of the configuration of each unit 301.

In FIG. 11, a unit 301G includes a bump 311G, a protection element 321G, a pull-up circuit 322G, and an input circuit 323G. In conjunction with the bump 311G, the unit 301G has, as minimum functions, a protection function by the protection element 321G, a pull-up function by the pull-up circuit 322G, and an input function by the input circuit 323G.

Seventh Example

Figure 12:
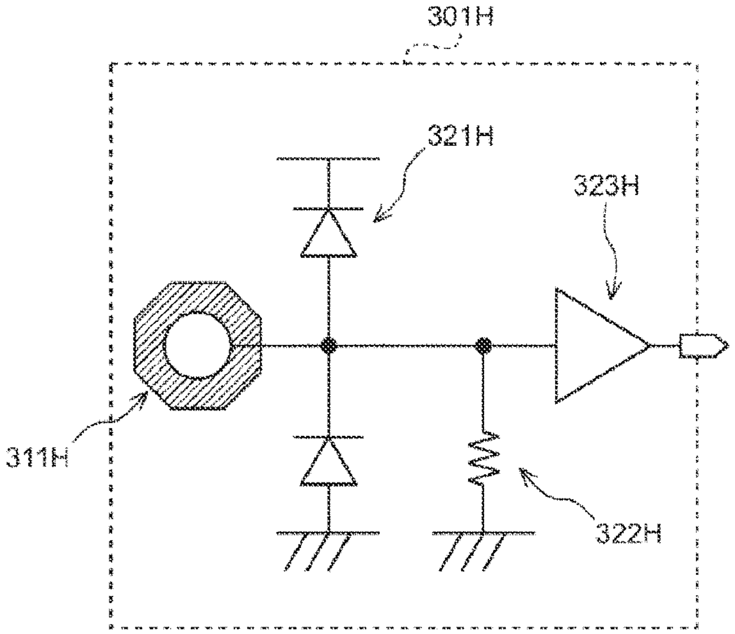
FIG. 12 is a diagram illustrating a seventh example of the configuration of the unit.

FIG. 12 is a diagram illustrating a seventh example of the configuration of each unit 301.

In FIG. 12, a unit 301H includes a bump 311H, a protection element 321H, a pull-down circuit 322H, and an input circuit 323H. In conjunction with the bump 311H, the unit 301H has, as minimum functions, a protection function by the protection element 321H, a pull-down function by the pull-down circuit 322H, and an input function by the input circuit 323H.

Eighth Example

Figure 13:
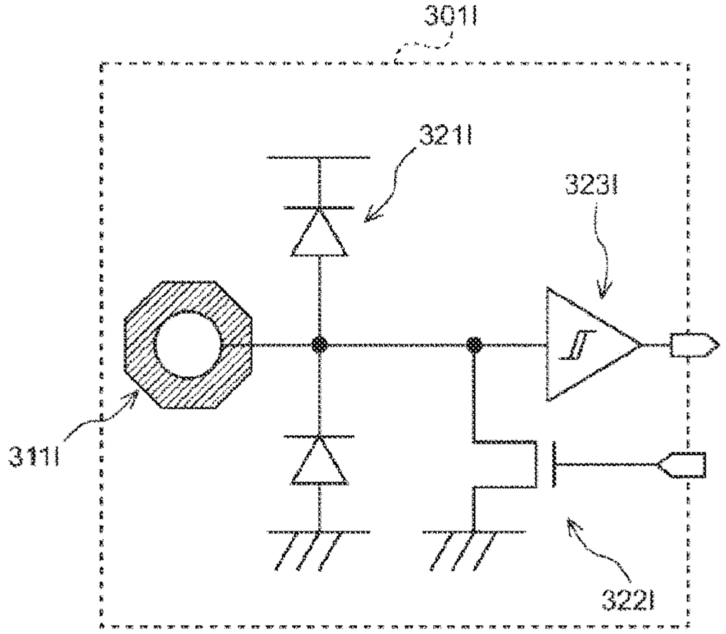
FIG. 13 is a diagram illustrating an eighth example of the configuration of the unit.

FIG. 13 is a diagram illustrating an eighth example of the configuration of each unit 301.

In FIG. 13, a unit 301I includes a bump 311I, a protection element 321I, a control circuit 322I, and a Schmitt input circuit 323I. In conjunction with the bump 311I, the unit 301I has, as minimum functions, a protection function by the protection element 321I, a control function by the control circuit 322I, and an input function by the Schmitt input circuit 323I.

Ninth Example

Figure 14:
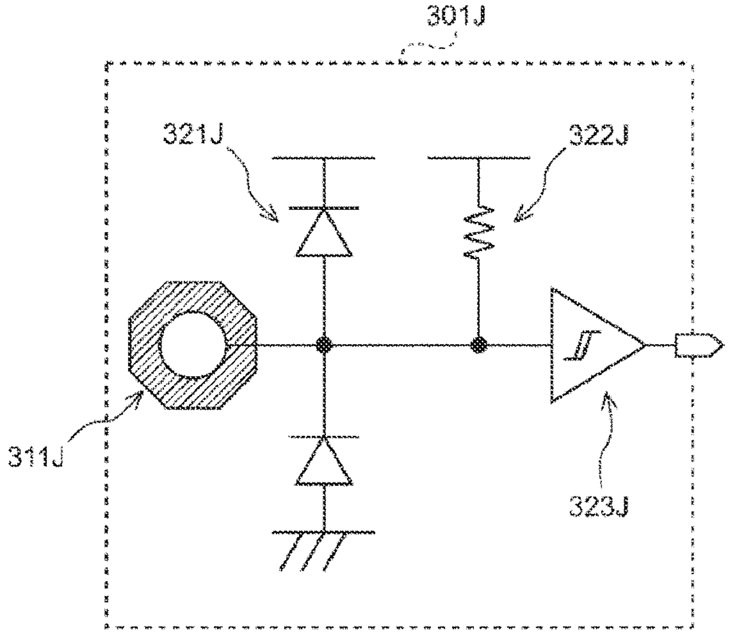
FIG. 14 is a diagram illustrating a ninth example of the configuration of the unit.

FIG. 14 is a diagram illustrating a ninth example of the configuration of each unit 301.

In FIG. 14, a unit 301J includes a bump 311J, a protection element 321J, a pull-up circuit 322J, and a Schmitt input circuit 323J. In conjunction with the bump 311J, the unit 301J has, as minimum functions, a protection function by the protection element 321J, a pull-up function by the pull-up circuit 322J, and an input function by the Schmitt input circuit 323J.

Tenth Example

Figure 15:
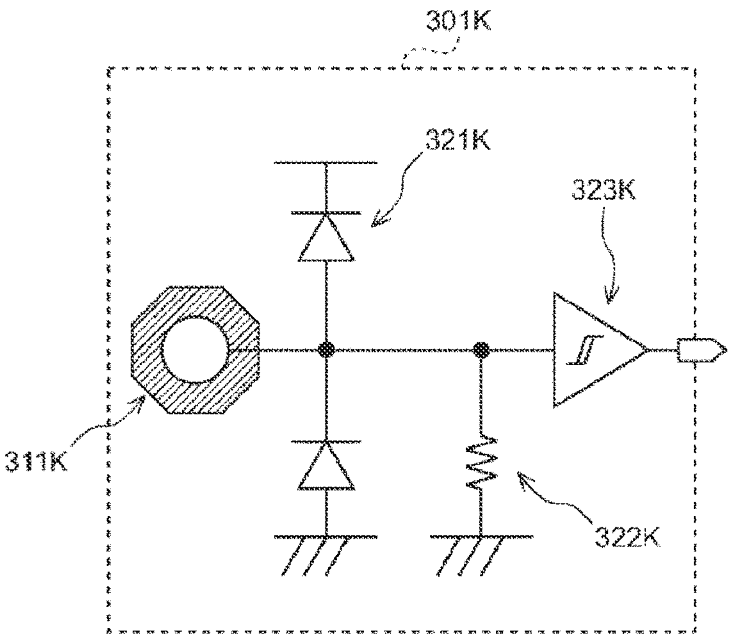
FIG. 15 is a diagram illustrating a tenth example of the configuration of the unit.

FIG. 15 is a diagram illustrating a tenth example of the configuration of each unit 301.

In FIG. 15, a unit 301K includes a bump 311K, a protection element 321K, a pull-down circuit 322K, and a Schmitt input circuit 323K. In conjunction with the bump 311K, the unit 301K has, as minimum functions, a protection function by the protection element 321K, a pull-down function by the pull-down circuit 322K, and an input function by the Schmitt input circuit 323K.

Eleventh Example

Figure 16:
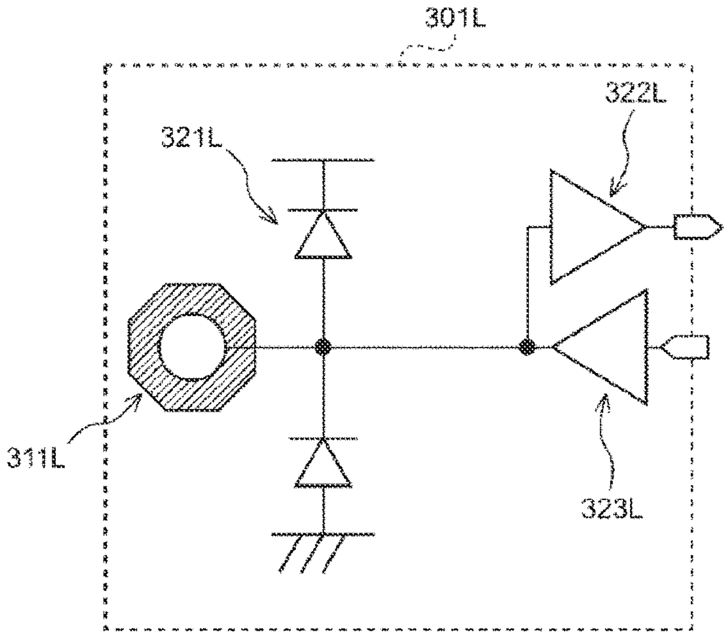
FIG. 16 is a diagram illustrating an eleventh example of the configuration of the unit.

FIG. 16 is a diagram illustrating an eleventh example of the configuration of each unit 301.

In FIG. 16, a unit 301L includes a bump 311L, a protection element 321L, an input circuit 322L, and an output circuit 323L. In conjunction with the bump 311L, the unit 301L has, as minimum functions, a protection function by the protection element 321L, an input function by the input circuit 322L, and an output function by the output circuit 323L.

Twelfth Example

Figure 17:
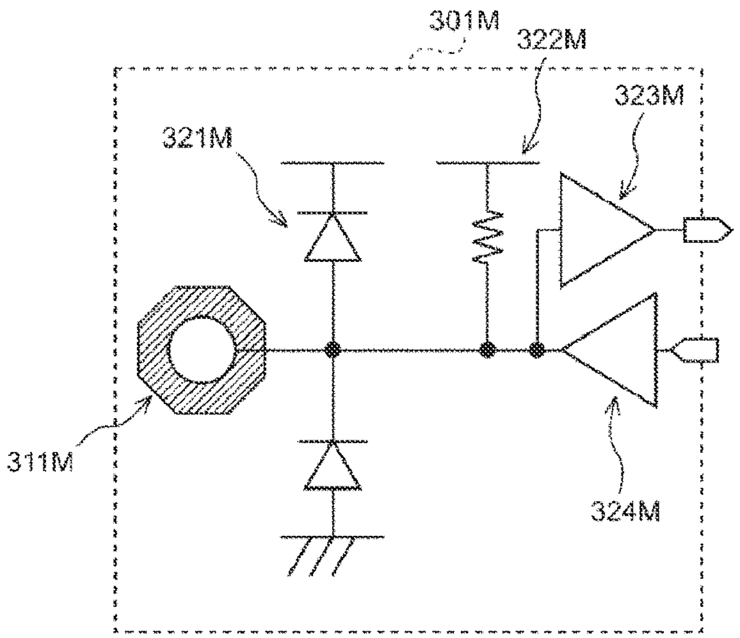
FIG. 17 is a diagram illustrating a twelfth example of the configuration of the unit.

FIG. 17 is a diagram illustrating a twelfth example of the configuration of each unit 301.

In FIG. 17, a unit 301M includes a bump 311M, a protection element 321M, a pull-up circuit 322M, an input circuit 323M, and an output circuit 324M. In conjunction with the bump 311M, the unit 301M has, as minimum functions, a protection function by the protection element 321M, a pull-up function by the pull-up circuit 322M, an input function by the input circuit 323M, and an output function by the output circuit 324M.

Thirteenth Example

Figure 18:
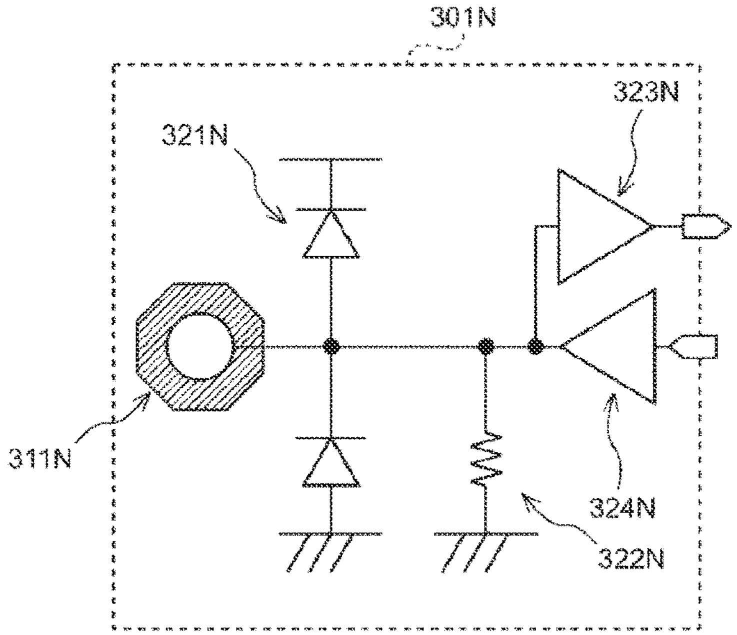
FIG. 18 is a diagram illustrating a thirteenth example of the configuration of the unit.

FIG. 18 is a diagram illustrating a thirteenth example of the configuration of each unit 301.

In FIG. 18, a unit 301N includes a bump 311N, a protection element 321N, a pull-down circuit 322N, an input circuit 323N, and an output circuit 324N. In conjunction with the bump 311N, the unit 301N has, as minimum functions, a protection function by the protection element 321N, a pull-down function by the pull-down circuit 322N, an input function by the input circuit 323N, and an output function by the output circuit 324N.

Fourteenth Example

Figure 19:
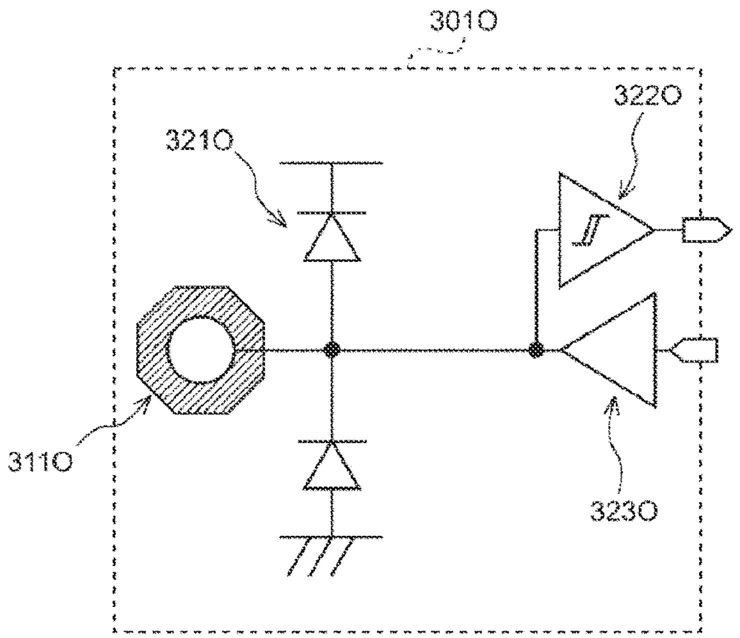
FIG. 19 is a diagram illustrating a fourteenth example of the configuration of the unit.

FIG. 19 is a diagram illustrating a fourteenth example of the configuration of each unit 301.

In FIG. 19, a unit 301O includes a bump 311O, a protection element 321O, a Schmitt input circuit 322O, and an output circuit 323O. In conjunction with the bump 311O, the unit 301O has, as minimum functions, a protection function by the protection element 321O, an input function by the Schmitt input circuit 322O, and an output function by the output circuit 323O.

Fifteenth Example

Figure 20:
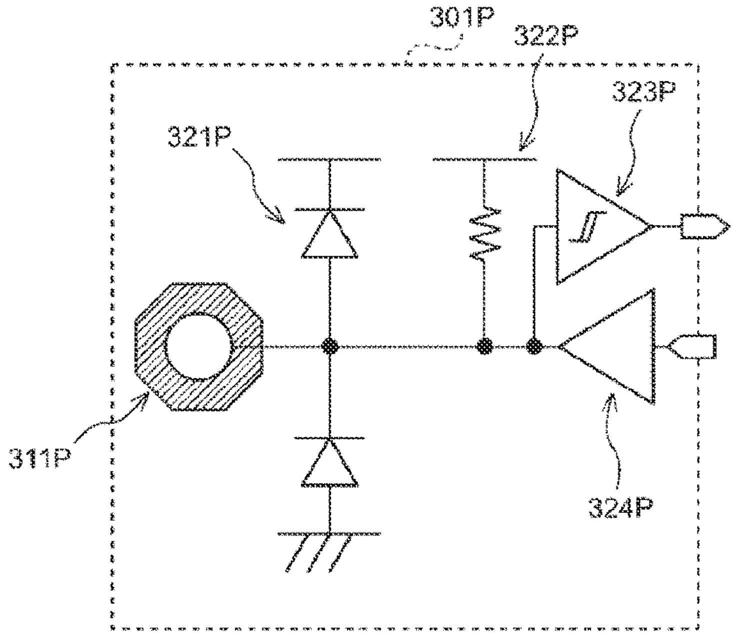
FIG. 20 is a diagram illustrating a fifteenth example of the configuration of the unit.

FIG. 20 is a diagram illustrating a fifteenth example of the configuration of each unit 301.

In FIG. 20, a unit 301P includes a bump 311P, a protection element 321P, a pull-up circuit 322P, a Schmitt input circuit 323P, and an output circuit 324P. In conjunction with the bump 311P, the unit 301P has, as minimum functions, a protection function by the protection element 321P, a pull-up function by the pull-up circuit 322P, an input function by the Schmitt input circuit 323P, and an output function by the output circuit 324P.

Sixteenth Example

Figure 21:
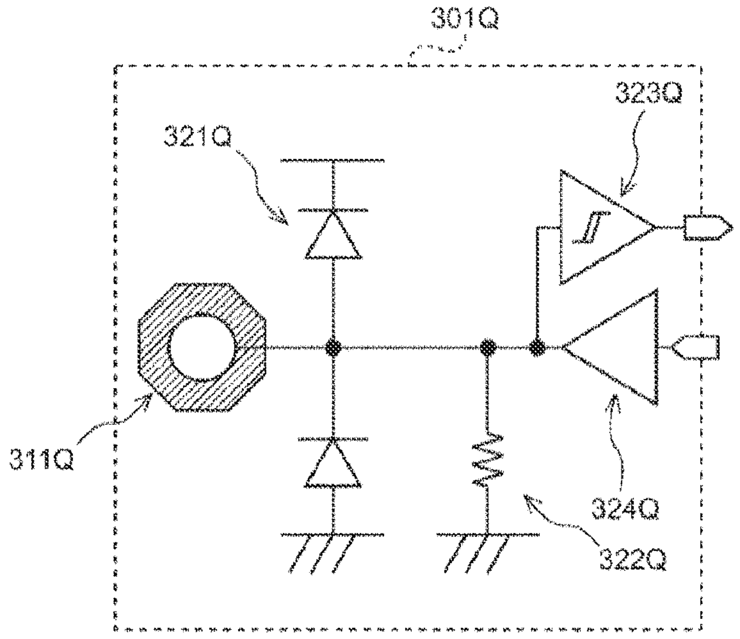
FIG. 21 is a diagram illustrating a sixteenth example of the configuration of the unit.

FIG. 21 is a diagram illustrating a sixteenth example of the configuration of each unit 301.

In FIG. 21, a unit 301Q includes a bump 311Q, a protection element 321Q, a pull-down circuit 322Q, a Schmitt input circuit 323Q, and an output circuit 324Q. In conjunction with the bump 311Q, the unit 301Q has, as minimum functions, a protection function by the protection element 321Q, a pull-down function by the pull-down circuit 322Q, an input function by the Schmitt input circuit 323Q, and an output function by the output circuit 324Q.

As described above, in each unit 301, the bump 311 and the minimum function(s) are configured as the pair of units having the information regarding the operation model, the delay, the power consumption, and the like. For example, the minimum function(s) can include at least one of the protection function, the input function, the output function, the power supply function, the ground supply function, the control function, the pull-up function, or the pull-down function.

In each unit 301, not only the physical configuration of only the corresponding bump 311, but also the minimum function are included to constitute the pair of units having the information regarding the operation model, the delay, the power consumption, and the like. It is therefore possible to achieve a library having the information regarding the operation model, the delay, and the power consumption. It is thus possible to conform to standard full-digital design.

Note that the combinations of the functions indicated by the foregoing equivalent circuit groups in FIGS. 5 to 21 are merely examples; therefore, another combination may be alternatively employed. In the example of the unit 301 illustrated in FIG. 16 or 19, for example, a control function by a control circuit may be provided.

(Example of Planar Layout)

Array arrangements obtained by combining the plurality of units 301 will be described with reference to FIGS. 22 to 24.

Figure 22:
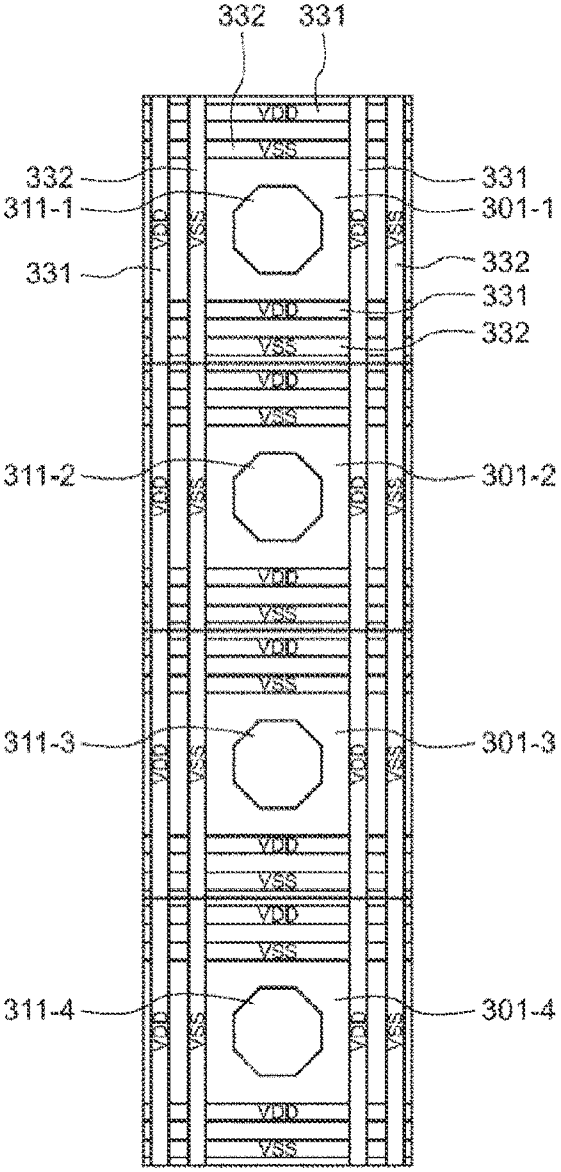
FIG. 22 is a diagram illustrating a first example of a planar layout of units arranged in an array form.

In FIG. 22, four units 301, that is, units 301-1 to 301-4, are arranged in an array form (one in a lateral direction (an east-west direction) by four in a vertical direction (a north-south direction)).

In the unit 301-1, as illustrated in FIG. 22, VDD wires 331 for a power supply and VSS wires 332 for a ground are formed in a rail shape in the lateral direction and the vertical direction at predetermined positions with respect to the bump 311-1. The VDD wires 331 and the VSS wires 332 are formed in a similar manner in the remaining units 301. In the four units 301 arranged in the 1×4 array form, therefore, the VDD wires 331 and the VSS wires 332 are arranged in the rail shape in the lateral direction and the vertical direction.

Figure 23:
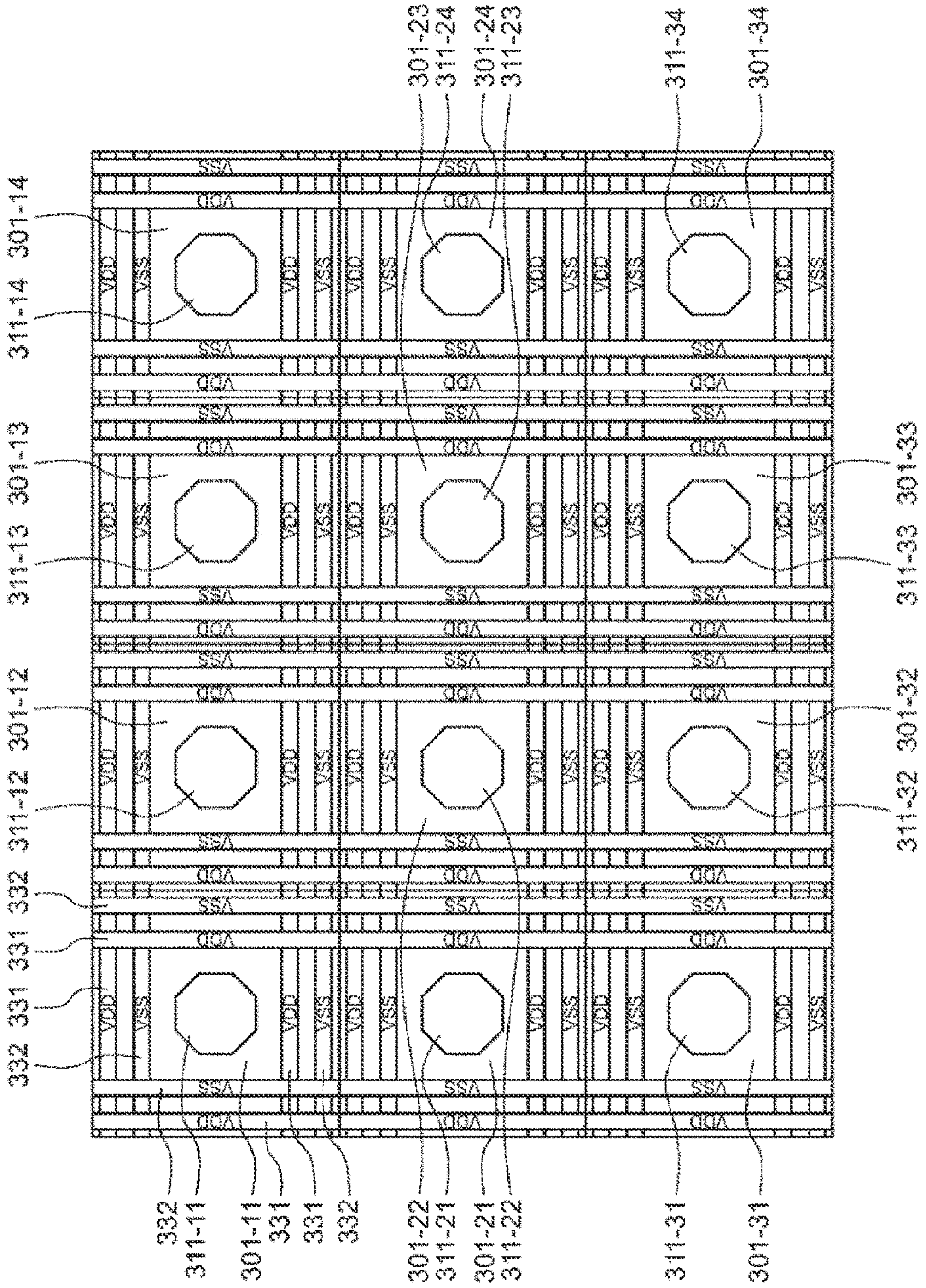
FIG. 23 is a diagram illustrating a second example of the planar layout of the units arranged in the array form.

In FIG. 23, 12 units 301, that is, units 301-11 to 301-31, units 301-12 to 301-32, units 301-13 to 301-33, and units 301-14 to 301-34, are arranged in an array form (four in the lateral direction by three in the vertical direction).

In the unit 301-11, as illustrated in FIG. 23, VDD wires 331 and VSS wires 332 are formed in a rail shape in the lateral direction and the vertical direction with respect to the bump 311-11. The VDD wires 331 and the VSS wires 332 are formed in a similar manner in the remaining units 301. In the 12 units 301 arranged in the 4×3 array form, therefore, the VDD wires 331 and the VSS wires 332 are arranged in the rail shape in the lateral direction and the vertical direction.

As illustrated in FIGS. 22 and 23, the plurality of units 301 is combined and arranged in a rectangular shape (a macro shape), so that the units 301 can be arranged to be adjacent to each other. Arranging the plurality of units 301 in the array form to form a rectangular shape enables connections of the VDD wires 331 and VSS wires 332 in the adjacent units 301; therefore, a minimum configuration can be achieved.

Note that FIG. 22 and FIG. 23 respectively illustrate the plurality of units 301 arranged in the 1×4 array form and the plurality of units 301 arranged in the 4×3 array form, in order to form a rectangular shape. However, the units 301 may be arranged by any number in the lateral direction and the vertical direction. Therefore, another array arrangement may be employed.

Figure 24:
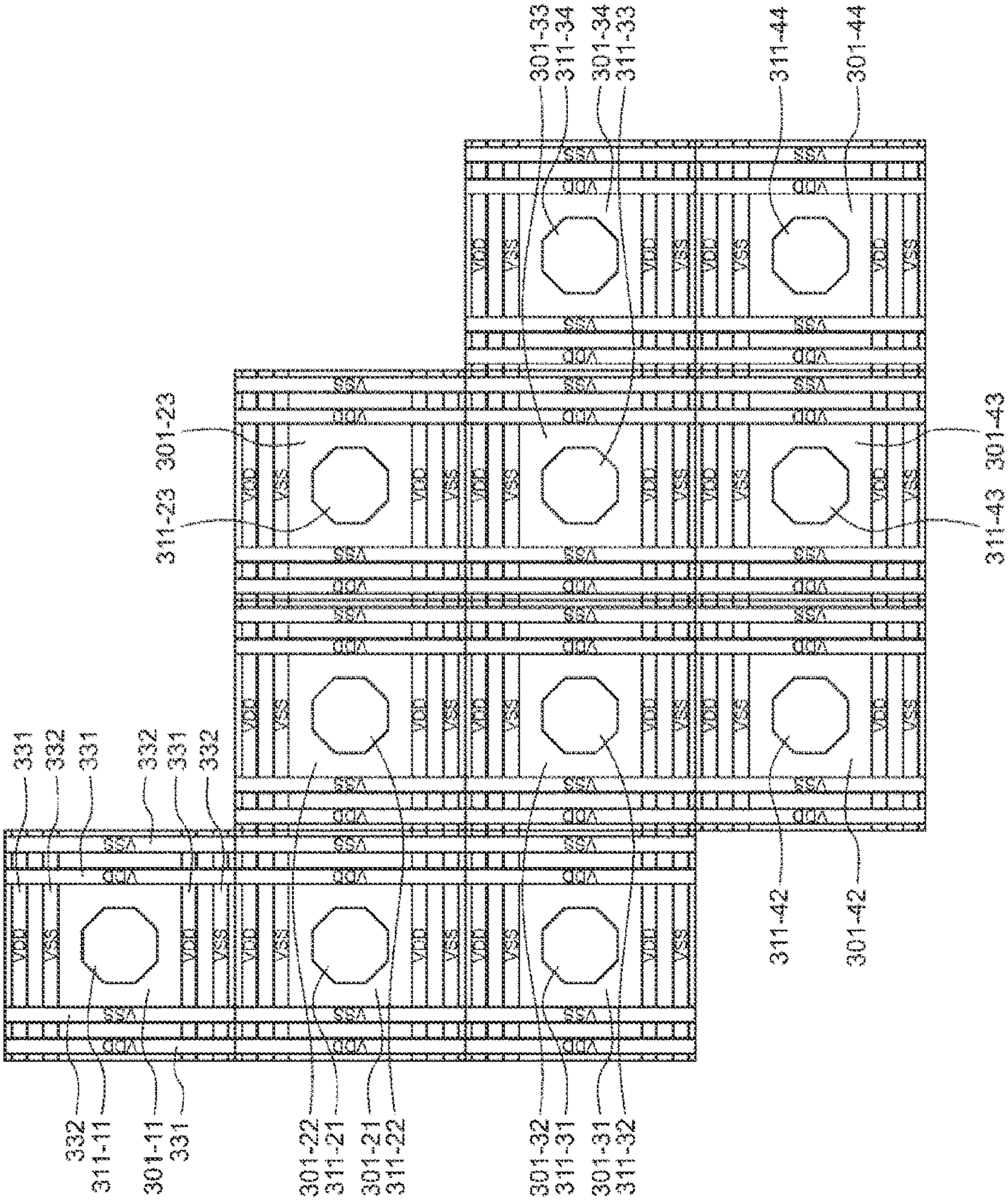
FIG. 24 is a diagram illustrating a third example of the planar layout of the units arranged in the array form.

In FIG. 24, 11 units 301, that is, units 301-11 to 301-31, units 301-22 to 301-42, units 301-23 to 301-43, and units 301-34 to 301-44, are arranged in an irregular shape in the lateral direction and in the vertical direction. Specifically, the unit 301-11 corresponds to a protrusion, and a region below the unit 301-31 and a region above the unit 301-34 each correspond to a recess.

In the unit 301-11, as illustrated in FIG. 24, VDD wires 331 and VSS wires 332 are formed in a rail shape in the lateral direction and the vertical direction with respect to the bump 311-11. The VDD wires 331 and the VSS wires 332 are formed in a similar manner in the remaining units 301. In the 11 units 301 arranged in the irregular shape, therefore, the VDD wires 331 and the VSS wires 332 are arranged in the rail shape in the lateral direction and the vertical direction.

As illustrated in FIG. 24, the plurality of units 301 is combined and arranged in the irregular shape (the macro shape), so that a minimal region in the substrate and a dead space can be effectively utilized. Therefore, arrangement efficiency in the substrate leads to reduction in chip size. As a result, the number of chips to be produced from a single wafer can be increased, and improvement in cost effectiveness can be expected. Furthermore, efficient arrangement in the substrate is possible; therefore, an area of the chip can be reduced, so that cost reduction can be achieved, for example.

Specific Application Example

Specific application examples of each unit 301 will be described with reference to FIGS. 25 to 28.

Figure 25:
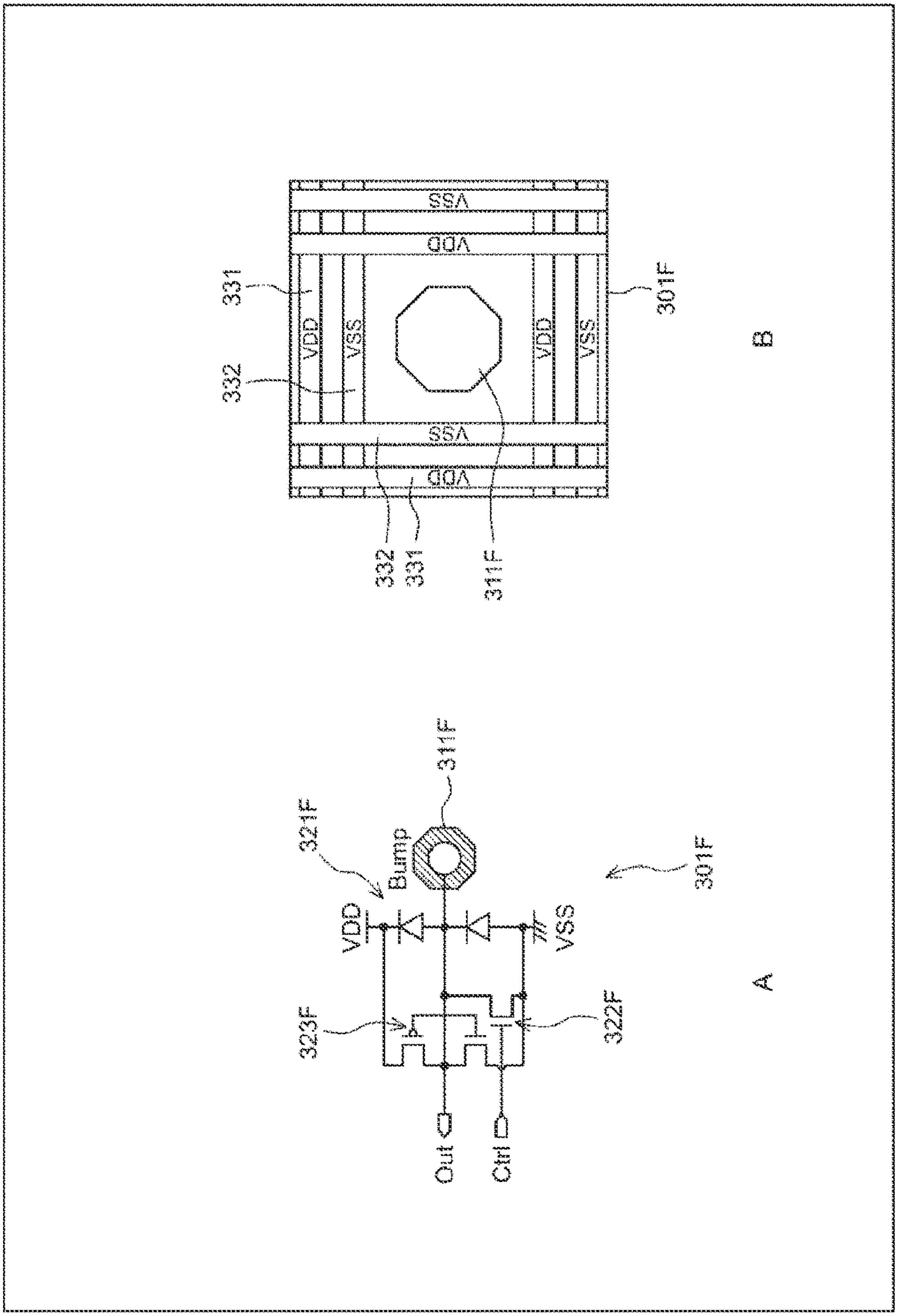
FIG. 25 is a diagram illustrating examples of a circuit diagram and a plan view of the unit on the substrate.

FIG. 25 is a diagram illustrating examples of a circuit diagram and a plan view of the unit 301 formed on the substrate 11. As illustrated in A of FIG. 25, a unit 301F includes, as in the configuration illustrated in FIG. 10, a bump 311F, a protection element 321F, a control circuit 322F, and an input circuit 323F. In the unit 301F, VDD wires 331 and VSS wires 332 are arranged in a rail shape in the lateral direction and the vertical direction with respect to the bump 311F (see B of FIG. 25).

Figure 26:
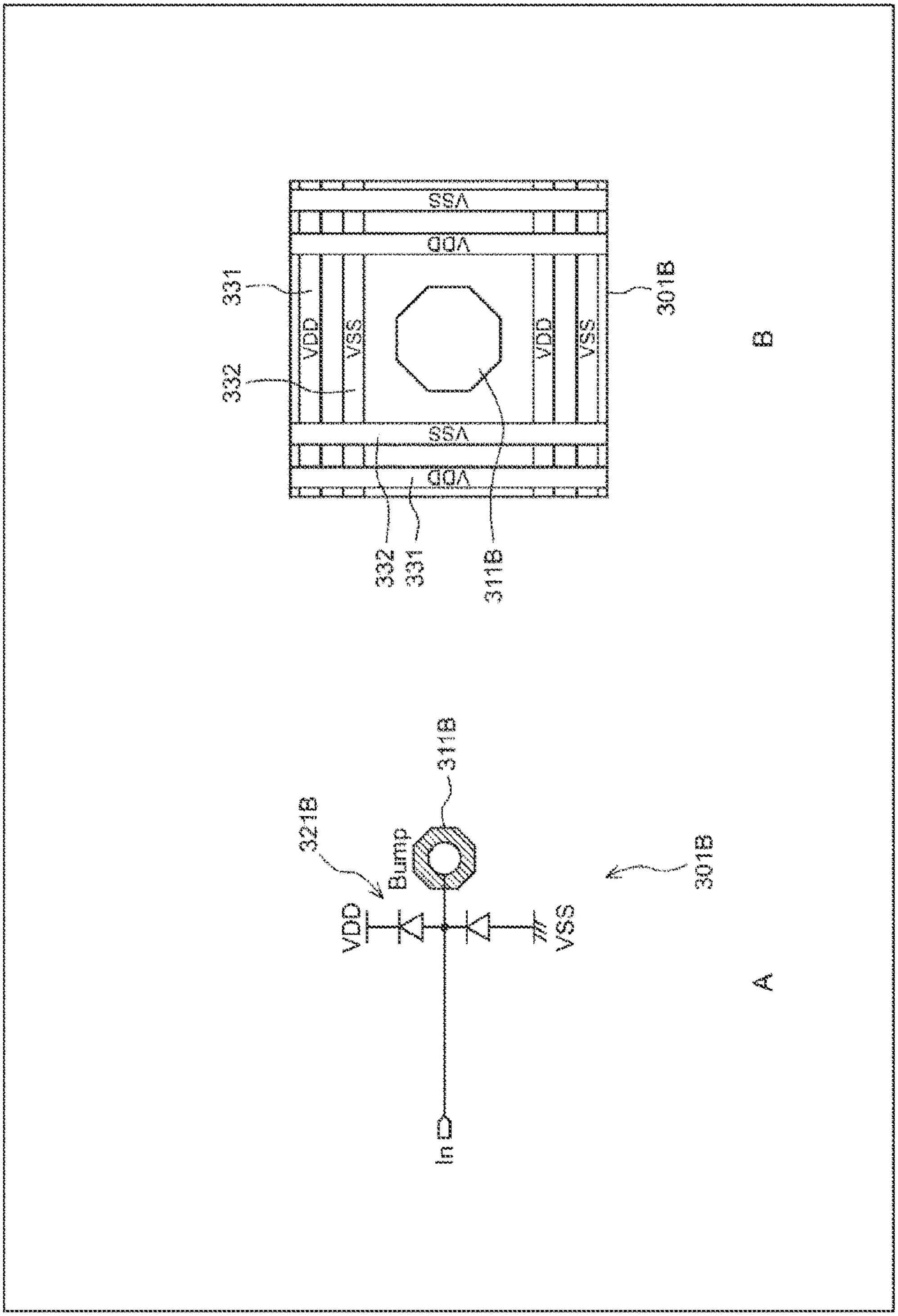
FIG. 26 is a diagram illustrating examples of a circuit diagram and a plan view of the unit on the substrate.

FIG. 26 is a diagram illustrating examples of a circuit diagram and a plan view of the unit 301 formed on the substrate 12. As illustrated in A of FIG. 26, a unit 301B includes, as in the configuration illustrated in FIG. 6, a bump 311B and a protection element 321B. In the unit 301B, VDD wires 331 and VSS wires 332 are arranged in a rail shape in the lateral direction and the vertical direction with respect to the bump 311B (see B of FIG. 26).

Figure 27:
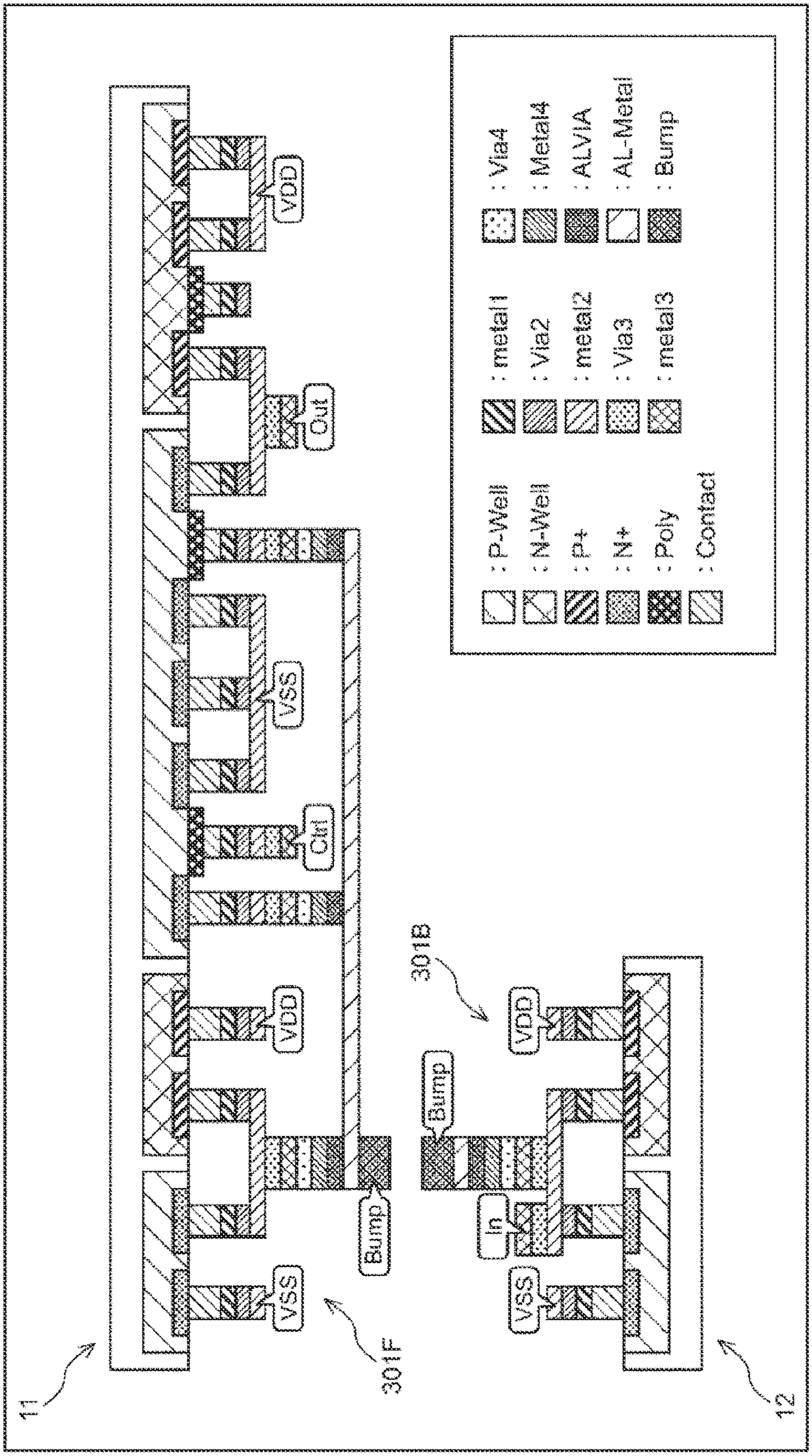
FIG. 27 is a diagram illustrating an example of a cross section of a bump bonding portion of the substrate.

FIG. 27 is a diagram illustrating an example of a cross section of a bump bonding portion between the substrate 11 and the substrate 12. In FIG. 27, a sectional view on an upper side of the figure illustrates a cross section of the unit 301F formed on the substrate 11 (see FIG. 25), and a sectional view on a lower side of the figure illustrates a cross section of the unit 301B formed on the substrate 12 (see FIG. 26). The bump 311F of the unit 301F and the bump 311B of the unit 301B are bonded together, so that the substrate 11 and the substrate 12 are bonded together with the bumps.

Note that, in the examples illustrated in FIGS. 25 to 27, the unit 301F is formed on the substrate 11 and the unit 301B is formed on the substrate 12; however, the combination of the units 301 formed on each substrate is not limited thereto, and may be any combination of, for example, the foregoing units 301 illustrated in FIGS. 5 to 21.

Figure 28:
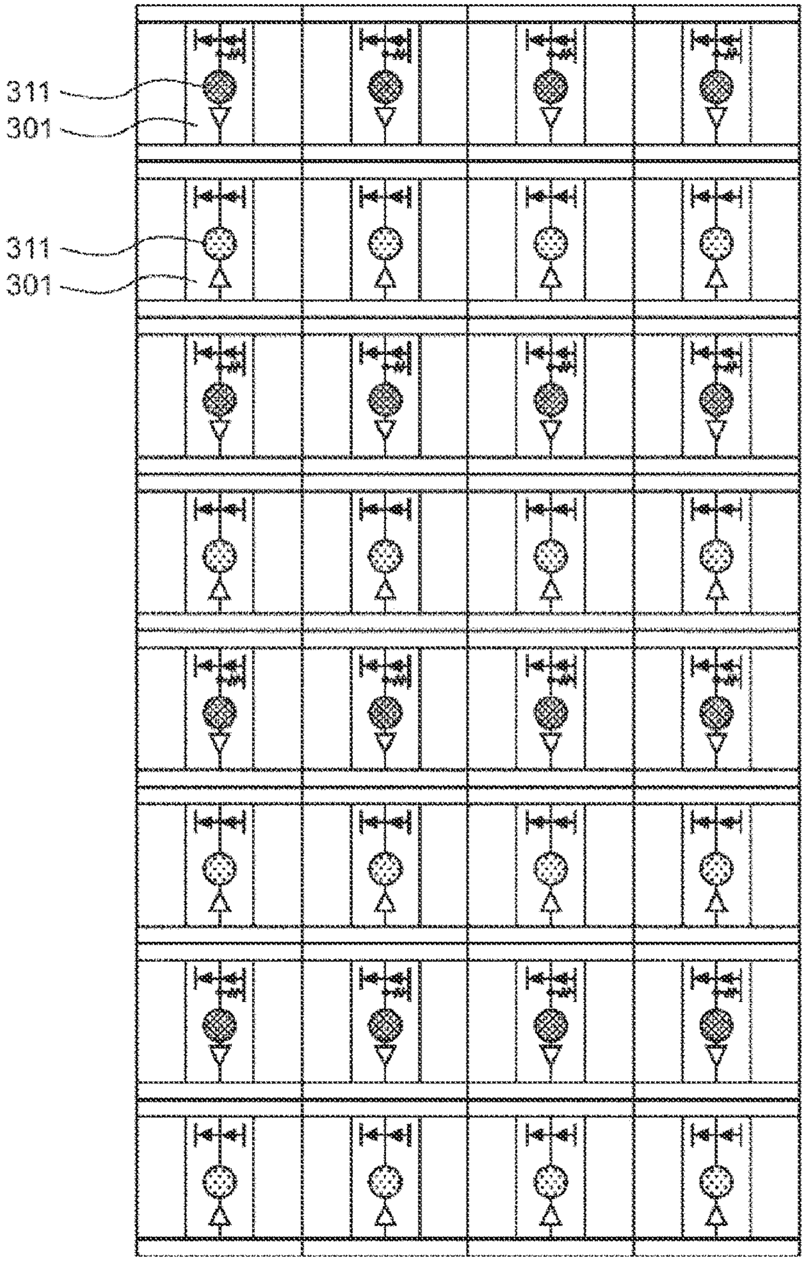
FIG. 28 is a diagram illustrating an example of an arrangement of the units.

Furthermore, in the examples illustrated in FIGS. 25 to 27, a pair of bumps are bonded together to form the bump bonding portion between the substrate 11 and the substrate 12. However, as described above, the plurality of units 301 may be combined and arranged in a predetermined shape (a macro shape) such as a rectangular shape. For example, as illustrated in FIG. 28, the plurality of units 301 is combined and arranged in the array form (four in the lateral direction by eight in the vertical direction), so that the units 301 can be arranged to be adjacent to each other.

As described above, in the semiconductor device 10 to which the present disclosure is applied, the substrate 11 and the substrate 12 each include a bump and a function as a pair of units. Therefore, even when, for example, a change is made in the course of design, parts can be flexibly recombined, so that design load can be controlled and reduced.

Also in the semiconductor device 10 to which the present disclosure is applied, the substrate 11 and the substrate 12 each include not only a physical configuration of only a bump, but also a minimum function as a pair of units having information regarding an operation model, a delay, power consumption, and the like. It is therefore possible to achieve a library having the information regarding the operation model, the delay, the power consumption, and the like. It is thus possible to conform to standard full-digital design.

That is, by applying the present disclosure, in a design style using a bump in a structure such as a CoC structure, in a case where only a physical portion of the bump is configured as a block circuit incorporated as an input/output terminal of a large-scale circuit configuration or a macro, it is possible to conform to a full-digital design style in such a manner that a lineup of units in a minimal (optimal) configuration sufficiently required for a designer who uses the units for design of a power supply, a ground, a signal, and the like is made into a cell library.

Furthermore, with regard to the foregoing unit groups (the equivalent circuits illustrated in FIGS. 5 to 21), by performing management and operation of a cell library that requires front end data constituted of various models such as an operation model, a delay model, and a power consumption model and back end data on physical data, it is possible to adopt a design method conforming to a standard (typical) semiconductor design flow utilizing an existing design tool.

2. Modification Example

The foregoing description covers general semiconductor devices by referring to the semiconductor device 10 to which the present disclosure is applied; however, the present disclosure is also applicable to a photodetection device such as a solid-state imaging device including a photoelectric conversion element. This photodetection device can be mounted on electronic devices such as a smartphone, a tablet terminal, a mobile phone, a personal computer (PC), a digital still camera, and a digital video camera.

Furthermore, the foregoing description exemplifies bump bonding in a CoC structure; however, the present disclosure is also applicable to, for example, bump bonding in other structures such as a CoW structure. Note that the term "substrate" used herein includes the meaning of a chip; therefore, the term "substrate" may be read as a "chip".

Note that an embodiment of the present disclosure is not limited to the foregoing embodiment, and various modifications are possible without departing from the scope of the present disclosure. Furthermore, the advantageous effects recited in the present specification are merely illustrative and not restrictive. The present technology may produce other advantageous effects.

Furthermore, the present disclosure can have the following configurations.

(1)

A semiconductor device including:

a first substrate; and a second substrate bonded to the first substrate with a bonding portion where a bump is bonded, in which the bump pairs up with a predetermined function to constitute a unit.

(2)

The semiconductor device as recited in (1), in which the first substrate includes a first unit including a first bump and a first function that pairs up with the first bump, the second substrate includes a second unit including a second bump and a second function that pairs up with the second bump, and the first bump and the second bump are bonded together.

(3)

The semiconductor device as recited in (2), in which the first substrate has a first surface on which a plurality of the first bumps is formed, the first bumps respectively constituting a plurality of the first units, and the second substrate has a second surface on which a plurality of the second bumps is formed, the second surface facing the first surface, and the second bumps respectively constituting a plurality of the second units.

(4)

The semiconductor device as recited in any of (1) to (3), in which on the unit, a wire for a power source and a wire for a ground are formed at predetermined positions with respect to the bump.

(5)

The semiconductor device as recited in (4), in which the wires are formed in a rail form in a first direction and a second direction perpendicular to the first direction, with respect to the bump.

(6)

The semiconductor device as recited in any of (1) to (5), in which the predetermined function includes at least one of a protection function, an input function, an output function, a power supply function, a ground supply function, a control function, a pull-up function, or a pull-down function.

(7)

The semiconductor device as recited in (2) or (3), in which the first function and the second function include different functions.

(8)

The semiconductor device as recited in (3), in which a plurality of the first units is arranged in an array form, and a plurality of the second units is arranged in an array form in correspondence with the plurality of the first units.

(9)

The semiconductor device as recited in (8), in which a plurality of the first units and a plurality of the second units are arranged in a rectangular form or an irregular form.

(10)

The semiconductor device as recited in any of (1) to (9), in which the semiconductor device is configured as a photodetection device.

REFERENCE SIGNS LIST

10 Semiconductor device
11 Substrate
12 Substrate
111, 112, 113 Bump
211, 212, 213 Bump
301, 301A to 301Q Unit
311, 311A to 311Q Bump
321A to 321Q Protection element
322C, 323L, 323O, 324M, 324N, 324P, 324Q Output circuit
322D Power supply circuit
322E GND supply circuit
322F, 322I Control circuit
322G, 322J, 322M, 322P Pull-up circuit
322H, 322K, 322N, 322Q Pull-down circuit
322L, 323F, 323G, 323H, 323M, 323N Input circuit
322O, 323I, 323J, 323K, 323P, 323Q Schmitt input circuit
331 VDD wire
332 VSS wire

What is claimed is:

1. A semiconductor device, comprising:

a first substrate, including:

an input unit, wherein the input unit includes a protection element and a bump;

an output unit, wherein the output unit includes a protection element and a bump; and a main circuit, wherein the main circuit is connected to the input unit and to the output unit; and a second substrate, including:

an input unit, wherein the input unit includes a protection element and a bump;

an output unit, wherein the output unit includes a protection element and a bump; and a main circuit, wherein the main circuit is connected to the input unit and to the output unit, wherein the second substrate is bonded to the first substrate with a bonding portion, wherein the bump of the input unit of the first substrate is bump bonded to the bump of the output unit of the second substrate, wherein the bump of the output unit of the first substrate is bump bonded to the bump of the input unit of the second substrate, and wherein the main circuit of the first substrate is operatively connected to the main circuit of the second substrate.

2. The semiconductor device according to claim 1, wherein the main circuit of the first substrate performs a first function that pairs up with the bump of the input unit of the first substrate, and wherein the main circuit of the second substrate performs a second function that pairs up with the bump of the input unit of the second substrate.

3. The semiconductor device according to claim 1, wherein the first substrate includes a plurality of input units that each include a bump and a plurality of output units that each include a bump, wherein the first substrate has a first surface on which a plurality of the bumps is formed, wherein the second substrate includes a plurality of input units that each include a bump and a plurality of output units that each include a bump, and wherein the second substrate has a second surface on which a plurality of the bumps of the second substrate is formed.

4. The semiconductor device according to claim 1, wherein each of the input units includes, a wire for a power source and a wire for a ground.

5. The semiconductor device according to claim 4, wherein the wires are formed in a rail form in a first direction and a second direction perpendicular to the first direction.

6. The semiconductor device according to claim 1, wherein each of the input and output units is associated with a predetermined function that includes a protection function and at least one of an input function, an output function, a power supply function, a ground supply function, a control function, a pull-up function, or a pull-down function.

7. The semiconductor device according to claim 2, wherein the first function and the second function include different functions.

8. The semiconductor device according to claim 3, wherein the plurality of the input units of the first substrate is arranged in an array form, and wherein the plurality of the output units of the second substrate is arranged in an array form in correspondence with the plurality of the input units of the first substrate.

9. The semiconductor device according to claim 8, wherein the plurality of the input units of the first substrate and the plurality of the output units of the second substrate are arranged in a rectangular form or an irregular form.

10. The semiconductor device according to claim 1, wherein the semiconductor device is configured as a photodetection device.

* * * * *